(12) United States Patent
Gieske et al.

(10) Patent No.: US 12,394,468 B2
(45) Date of Patent: Aug. 19, 2025

(54) ROW HAMMER MITIGATION USING HIERARCHICAL DETECTORS

(71) Applicant: Micron Technology, Inc., Boise, ID (US)

(72) Inventors: Edmund J. Gieske, Cedar Park, TX (US); Cagdas Dirik, Indianola, WA (US); Robert M. Walker, Raleigh, NC (US)

(73) Assignee: Micron Technology, Inc., Boise, ID (US)

( * ) Notice: Subject to any disclaimer, the term of this patent is extended or adjusted under 35 U.S.C. 154(b) by 180 days.

(21) Appl. No.: 18/204,786

(22) Filed: Jun. 1, 2023

(65) Prior Publication Data

US 2023/0395126 A1 Dec. 7, 2023

Related U.S. Application Data

(60) Provisional application No. 63/348,374, filed on Jun. 2, 2022.

(51) Int. Cl.
*G11C 11/406* (2006.01)
*G11C 11/4078* (2006.01)

(52) U.S. Cl.
CPC .... *G11C 11/4078* (2013.01); *G11C 11/40618* (2013.01)

(58) Field of Classification Search
CPC ................. G11C 11/4078; G11C 11/40618
See application file for complete search history.

(56) References Cited

U.S. PATENT DOCUMENTS

| | | | |
|---|---|---|---|
| 9,032,141 B2 * | 5/2015 | Bains | G06F 13/1636 711/106 |
| 11,282,561 B2 | 3/2022 | Nale et al. | |
| 2014/0085995 A1 | 3/2014 | Greenfield et al. | |
| 2023/0237152 A1 * | 7/2023 | Ayyapureddi | G06F 21/54 726/22 |
| 2024/0096395 A1 * | 3/2024 | Cho | G11C 11/408 |

* cited by examiner

*Primary Examiner* — Min Huang
(74) *Attorney, Agent, or Firm* — Brooks, Cameron & Huebsch, PLLC

(57) ABSTRACT

An apparatus can include a number of memory devices and a controller coupled to one or more of the number of memory devices. The controller can include row hammer detection circuitry configured to receive signaling indicative of a row activation command having a row address, increment a row counter corresponding to the row address stored in a stored in a data structure in a register or storage device, determine whether the incremented row counter is greater than a row hammer threshold, and issue a row hammer mitigation command to mitigate row hammer.

20 Claims, 5 Drawing Sheets

ROW HAMMER MITIGATION USING HIERARCHICAL DETECTORS

PRIORITY INFORMATION

This application claims the benefit of U.S. Provisional Application No. 63/348,374, filed on Jun. 2, 2022, the contents of which are incorporated herein by reference.

TECHNICAL FIELD

Embodiments of the disclosure relate generally to memory sub-systems, and more specifically, relate to row hammer mitigation using hierarchical detectors.

BACKGROUND

A memory sub-system can include one or more memory devices that store data. The memory devices can be, for example, non-volatile memory devices and volatile memory devices. In general, a host system can utilize a memory sub-system to store data at the memory devices and to retrieve data from the memory devices.

BRIEF DESCRIPTION OF THE DRAWINGS

The present disclosure will be understood more fully from the detailed description given below and from the accompanying drawings of various embodiments of the disclosure.

DETAILED DESCRIPTION

Figure 1:
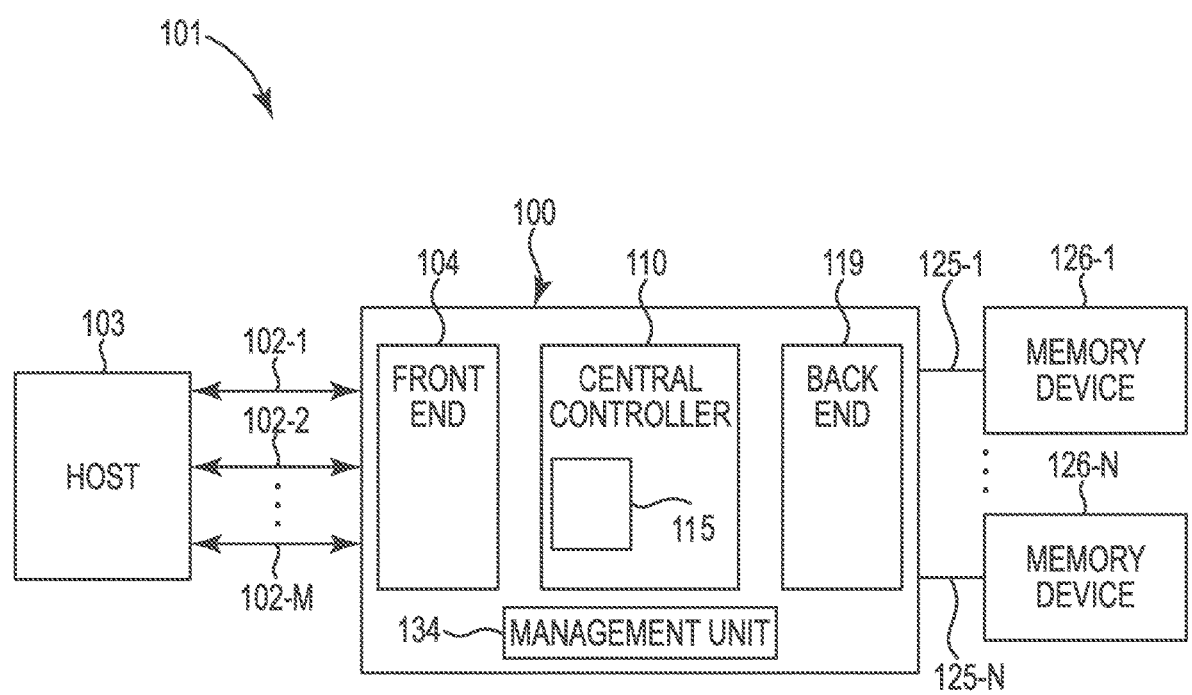
FIG. 1 is a functional block diagram of a computing system including a memory controller in accordance with a number of embodiments of the present disclosure.

Memory controllers for row hammer mitigation using hierarchical detectors are described. The memory controller can be included in an apparatus such as a memory system. A memory sub-system can be a storage system, storage device, a memory module, or a combination of such. An example of a memory sub-system is a storage system such as a solid-state drive (SSD).

In some embodiments, the memory system can be a non-deterministic memory protocol compliant memory system such as a compute express link (CXL) compliant memory system. For instance, the host interface can be managed with CXL protocols and be coupled to the host via an interface configured for a peripheral component interconnect express (PCIe) protocol. CXL is a high-speed central processing unit (CPU)-to-device and CPU-to-memory interconnect designed to accelerate next-generation data center performance. CXL technology maintains memory coherency between the CPU memory space and memory on attached devices, which allows resource sharing for higher performance, reduced software stack complexity, and lower overall memory system cost. CXL is designed to be an industry open standard interface for high-speed communications, as accelerators are increasingly used to complement CPUs in support of emerging applications such as artificial intelligence and machine learning. CXL technology is built on the PCIe infrastructure, leveraging PCIe physical and electrical interfaces to provide advanced protocol in areas such as input/output (I/O) protocol, memory protocol (e.g., initially allowing a host to share memory with an accelerator), and coherency interface.

Row hammer refers to undesirable changes in capacitor voltages of a row of memory cells as a result of a neighboring row being frequently accessed. A row hammer attack may be employed to intentionally alter, gain access to, and/or corrupt data stored in memory by repeatedly accessing a particular row in rapid succession. For instance, a first row that is adjacent to a second row may be accessed repeatedly over a relatively short period of time. Accessing the first row repeatedly may leak voltage from memory cells coupled to the second row to memory cells coupled to the first row. The voltage leakage may cause data corruption to data stored in the memory cells coupled to the second row. The first row and the second row may not be directly adjacent but may be within a number of rows of each other. As used herein, memory cells and/or rows can be adjacent to each other if the memory cells and/or rows are physically located next to each other in a memory array or are within physical proximity sufficient to allow for the leakage of a charge from memory cells coupled to a row to different memory cells coupled to a different row. A row of memory cells can be next to a different row of memory cells if the addresses of the rows are consecutive and/or if there are no other rows between the adjacent rows. Memory cells may be adjacent to each other if the memory cells are coupled to rows that are adjacent to each other.

Moreover, due to various physical effects of shrinking manufacturing process geometries, a row hammer thresholds of memory sub-systems have decreased to a level at which applications running on a host of a computer system can inadvertently corrupt their own data or the data of different applications sharing the same memory. As used herein, a row hammer threshold is a threshold quantity of accesses of a row of memory cells after which the memory cells in the row leak a charge.

Some row hammer detector algorithms may be probabilistic and thus cannot guarantee perfect (e.g., complete, accurate, and/or precise) prevention of data corruption. For instance, if an aggressor knows sufficient details of these existing row hammer detection methods and their implementation mechanisms, the aggressor can attack their weaknesses to bypass or break the detector and corrupt data.

Some row hammer detector algorithm implementations require an amount of memory and/or operating power that are too high to be practically useful. For instance, approaches that seek to eliminate any false positives may utilize large amounts of memory and/or operating power to achieve such a goal and thereby may not be practically useful. Some approaches can be implemented with a large content addressable memory (CAM). The CAM can compare input search data against a table of stored data and return an address of matching data. However, the large size of the CAM (e.g., greater than 2.5 megabytes) can make such approaches utilize a large amounts of memory and/or operating power.

Aspects of the present disclosure address the above and other deficiencies by implementing row hammer mitigation using hierarchical detectors. As used herein, hierarchal detectors generally refer to row hammer detection circuitry included in an individual memory controller that is configured to perform various aspects related to row hammer mitigation. For instance, the row hammer detection circuitry can refer to a plurality of row hammer detectors in an individual memory controller. The row hammer detection circuitry can be included in the same or different physical portions (e.g., a central portion, back-end portion, etc.) of the memory controller. For instance, a first row hammer detector can be included in the central portion (e.g., in a central controller) and a second row hammer detector can be included in a different portion such as the back-end portion (e.g., in a channel controller/bank controller). However, in some embodiments, the row hammer detection circuitry (e.g., row hammer detectors) can be included in the same portion (e.g., in a central controller) of a memory controller.

In any case, hierarchal detectors can permit enhanced row hammer detection as compared to other approaches that rely on an individual row hammer detector such as an individual row hammer detector on a memory device. That is, in contrast to other approaches embodiments herein employ row hammer detector-free memory devices. The hierarchal detectors herein can be located on and executed entirely on one or more portions of a memory controller, whereas other approaches rely on a row hammer detector on a memory device and thus are constrained by the computational power and/or size of the memory device. For example, other approaches may be constrained by a size of a buffer and/or a DIMM of a DRAM or other type of memory device. Therefore, such approaches may be limited to an individual row hammer detector on the memory device. Conversely, approaches herein permit use of a plurality of row hammer detectors, different types of row hammer detectors, different row hammer mitigation commands, and/or enhanced/complex row hammer detectors (e.g., that are a capable of processing higher rates of events), that utilize larger amounts of power, and/or which can process higher rates of data.

Aspects of the present disclosure can also utilize a smaller memory (e.g., SRAM) size, and/or can realize a smaller max false positive rate (in the absence of any false negatives) which will have no risk of "deny of services" than various previous approaches. For instance, hierarchal detectors can be tailored to detect different types of row hammer events (e.g., single-sided row hammer attacks, double-sided row hammer attacks, etc.) and/or are include different types of row hammer detectors (e.g., a high-speed first row hammer detector to filter events and a second high-granularity row hammer detector to confirm the presence of row hammer, etc.). Thus, the accuracy, speed, and/or a reduction in any quantity of false negative/positives can be enhanced as compared to an individual generic row hammer detector intended to detect various/all types of row hammer and/or a detector that is limited by an amount of space/computational power available at a memory device.

Although the examples provided herein are in the context of row hammer attacks, the examples can also be applied to the loss of data due to memory cell leakage caused by accessing the memory cells or adjacent memory cells at a greater rate than the RHT.

Interfaces such as peripheral component interconnect express (PCIe), compute express link (CXL), cache coherent interconnect for accelerators (CCIX), etc. allow connecting a variety of memory devices to a host system. The combination of interfaces and memory technology improvements can allow for deploying "far memory", which can consist of system memory (e.g., memory devices) being implemented behind a front-end of a memory sub-system such as PCIe, CXL, CCIX, GenZ, etc. As used herein, the front-end of the memory sub-system can also be referred to as an interface of the memory sub-system or as a front-end of a controller of the memory sub-system. As used herein, the front-end of the memory sub-system can comprise hardware and/or firmware configured to receive data (e.g., requests and/or data) and provide the data to a back-end of the memory sub-system. The back-end of the memory sub-system can comprise hardware and/or firmware to receive the data (e.g., requests and/or data) from the front-end of the memory sub-system and can include perform the requests provided from the host on the memory devices of the memory sub-system.

As used herein, the singular forms "a", "an", and "the" include singular and plural referents unless the content clearly dictates otherwise. Furthermore, the word "may" is used throughout this application in a permissive sense (i.e., having the potential to, being able to), not in a mandatory sense (i.e., must). The term "include," and derivations thereof, mean "including, but not limited to." The term "coupled" means directly or indirectly connected. It is to be understood that data can be transmitted, received, or exchanged by electronic signals (e.g., current, voltage, etc.) and that the phrase "signal indicative of [data]" represents the data itself being transmitted, received, or exchanged in a physical medium. The signal can correspond to a command (e.g., a read command, a write command, etc.).

The figures herein follow a numbering convention in which the first digit or digits correspond to the drawing figure number and the remaining digits identify an element or component in the drawing. Similar elements or components between different figures may be identified by the use of similar digits. For example, 110 may reference element "10" in FIG. 1, and a similar element may be referenced as 210 in FIG. 2. Analogous elements within a Figure may be referenced with a hyphen and extra numeral or letter. See, for example, elements 102-1, 102-2, 102-M in FIG. 1. Such analogous elements may be generally referenced without the hyphen and extra numeral or letter. For example, elements 102-1, 102-2, 102-M may be collectively referenced as 102. As used herein, the designators "M" and "N", particularly with respect to reference numerals in the drawings, indicates that a number of the particular feature so designated can be included. As will be appreciated, elements shown in the various embodiments herein can be added, exchanged, and/ or eliminated so as to provide a number of additional embodiments of the present disclosure. In addition, as will be appreciated, the proportion and the relative scale of the elements provided in the figures are intended to illustrate certain embodiments of the present invention and should not be taken in a limiting sense.

FIG. 1 is a functional block diagram of a computing system 101 including a memory controller 100 in accordance with a number of embodiments of the present disclosure. The memory controller 100 can include a front end portion 104, a central controller portion 110, and a back end portion 119. The computing system 101 can include a host 103 and memory devices 126-1, . . . , 126-N coupled to the memory controller 100. The memory controller 100 which is coupled to the host 103 can be discrete from the one or more of the memory devices 126-1, . . . , 126-N.

The front end portion 104 includes an interface and interface management circuitry to couple the memory controller 100 to the host 103 through input/output (I/O) lanes 102-1, 102-2, . . . , 102-M and circuitry to manage the I/O lanes 102. There can be any quantity of I/O lanes 102, such as eight, sixteen, or another quantity of I/O lanes 102. In some embodiments, the I/O lanes 102 can be configured as a single port. In at least one embodiment, the interface between the memory controller 100 and the host 103 can be a PCIe physical and electrical interface operated according to a CXL protocol.

The central controller portion 110 can include and/or be referred to as data management circuitry. The central controller portion 110 can control, in response to receiving a request from the host 103, performance of a memory operation. Examples of the memory operation include memory access request such as a read operation to read data from a memory device 126 or a write operation to write data to a memory device 126.

The central controller portion 110 can include a row hammer detection circuitry 115. For instance, in some embodiments the central controller portion 110 can include row hammer detection circuitry 115 that includes a first row hammer detector and a second row hammer detector. However, as detailed herein, in some embodiments at least a portion of the row hammer detection circuitry 115 can be located elsewhere within the memory controller 100 such as having at least a portion of the row hammer detection circuitry 115 located in the back end portion 119.

The central controller portion 110 can generate error detection information and/or error correction information based on data received from the host 103. The central controller portion 110 can perform error detection operations and/or error correction operations on data received from the host 103 or from the memory devices 126. An example of an error detection operation is a cyclic redundancy check (CRC) operation. CRC may be referred to as algebraic error detection. CRC can include the use of a check value resulting from an algebraic calculation using the data to be protected. CRC can detect accidental changes to data by comparing a check value stored in association with the data to the check value calculated based on the data. An example of an error correction operation is an error correction code (ECC) operation. ECC encoding refers to encoding data by adding redundant bits to the data. ECC decoding refers to examining the ECC encoded data to check for any errors in the data. In general, the ECC can not only detect the error but also can correct a subset of the errors it is able to detect.

The back end portion 119 can include a media controller and a physical (PHY) layer that couples the memory controller 100 to the memory devices 126. As used herein, the term "PHY layer" generally refers to the physical layer in the Open Systems Interconnection (OSI) model of a computing system. The PHY layer may be the first (e.g., lowest) layer of the OSI model and can be used transfer data over a physical data transmission medium. In some embodiments, the physical data transmission medium can include channels 125-1, ..., 125-N. The channels 125 can include a sixteen pin data bus and a two pin data mask inversion (DMI) bus, among other possible buses. The back end portion 119 can exchange (e.g., transmit or receive) data with the memory devices 126 via the data pins and exchange error detection information, RAID information, and/or error correction information with the memory devices 126 via the DMI pins. The error detection information and/or error correction information can be exchanged contemporaneously with the exchange of data.

An example of the memory devices 126 is dynamic random access memory (DRAM) operated according to a protocol such as low-power double data rate (LPDDRx), which may be referred to herein as LPDDRx DRAM devices, LPDDRx memory, etc. The "x" in LPDDRx refers to any of a number of generations of the protocol (e.g., LPDDR5).

In some embodiments, the memory controller 100 can include a management unit 134 to initialize, configure, and/or monitor characteristics of the memory controller 100. The management unit 134 can include an I/O bus to manage out-of-band data and/or commands, a management unit controller to execute instructions associated with initializing, configuring, and/or monitoring the characteristics of the memory controller, and a management unit memory to store data associated with initializing, configuring, and/or monitoring the characteristics of the memory controller 100. As used herein, the term "out-of-band" generally refers to a transmission medium that is different from a primary transmission medium of a network. For example, out-of-band data and/or commands can be data and/or commands transferred to a network using a different transmission medium than the transmission medium used to transfer data within the network.

Figure 2:
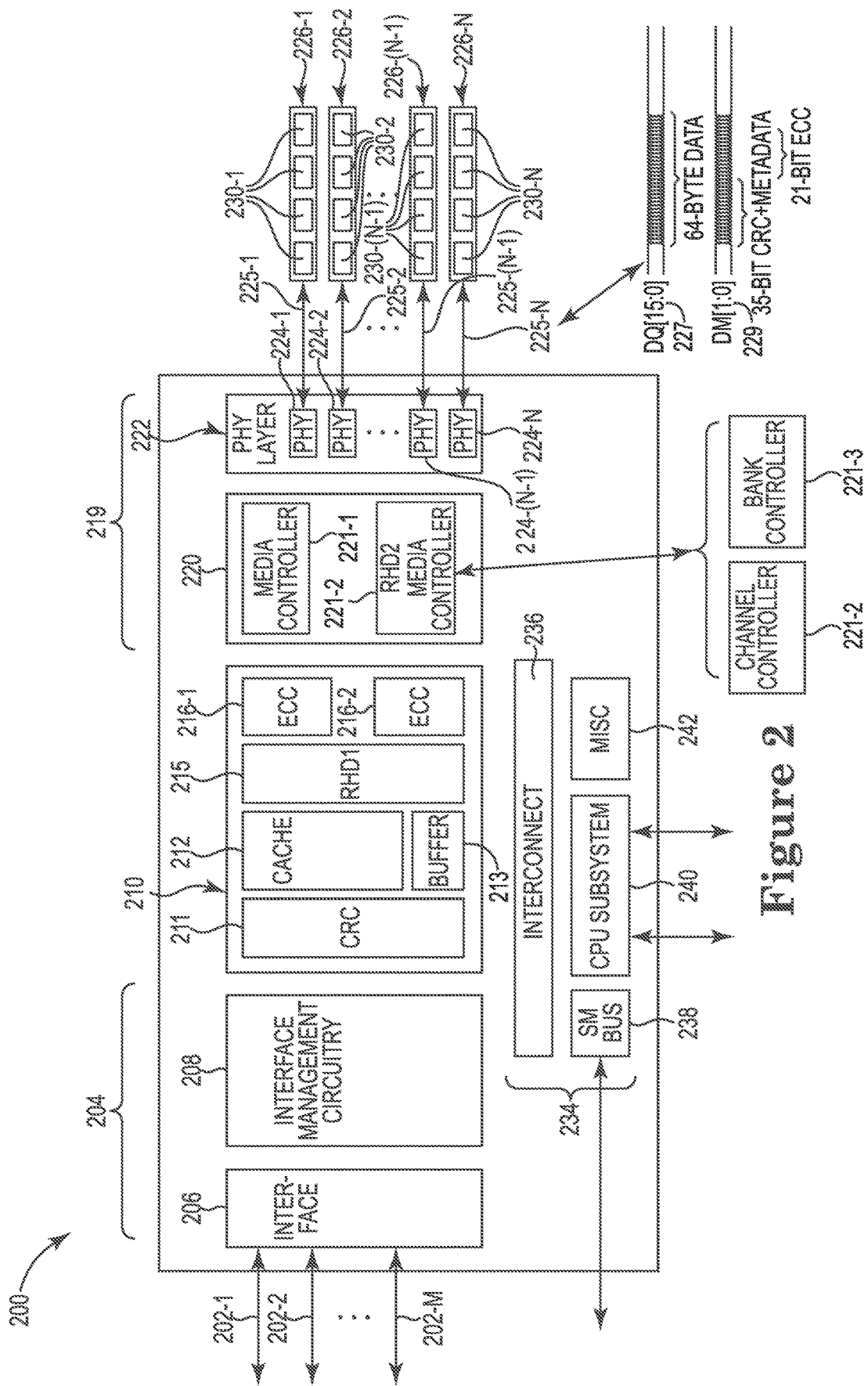
FIG. 2 is a functional block diagram of a memory controller having a first configuration in accordance with a number of embodiments of the present disclosure.

FIG. 2 is a functional block diagram of a memory controller 200 having a first configuration in accordance with a number of embodiments of the present disclosure. As shown in FIG. 2, a front end portion 204 can include an interface 206, which includes multiple I/O lanes 202-1, 202-2, ..., 202-M, as well as interface management circuitry 208 to manage the interface 206. An example of the interface 206 is a peripheral component interconnect express (PCIe) 5.0 interface. In some embodiments, the memory controller 200 can receive access requests involving at least one of the cache memory 212 and the memory devices (e.g., die) 226-1, 226-2, ..., 226-(N-1), 226-N via the interface 206 according to a non-deterministic memory protocol such as a CXL protocol. The interface 206 can receive data from a host (e.g., the host 103 shown in FIG. 1) through the I/O lanes 202. The interface management circuitry 208 may use a non-deterministic protocol such as CXL protocols to manage the interface 206 and may be referred to as CXL interface management circuitry 208. The CXL interface management circuitry 208 can be coupled to a host via the PCIe interface 206.

Central controller 210 (also referred to herein as data management circuitry 210) can be coupled to the interface management circuitry 208. The data management circuitry 210 can be configured to cause performance of a memory operation. The data management circuitry 210 can include at least one of error detection circuitry 211 (e.g., "CRC circuitry") and error correction circuitry 216. The error detection circuitry 211 can be configured to perform error detection operations on data. For example, the error detection circuitry 211 can be configured to generate a check value resulting from an algebraic calculation on data received from the interface management circuitry 208 and to transmit the check value to at least one of the cache memory 212, buffer 213, and media control circuitry 220. The check value can be referred to as CRC data or error detection data.

In at least one embodiment, the error detection circuitry is configured to perform an error detection operation on data received from the interface management circuitry prior to the data being cached and/or operated on by the error correction circuitry 216. Another example of an error detection operation is to generate a check value resulting from an algebraic calculation on data received from the media control circuitry and a comparison of that check value with a check value received from the media control circuitry 220 to determine whether the data includes an error (e.g., if the two check values are not equal).

The data management circuitry 210 can include a cache memory (cache) 212 to store data, error detection information, error correction information, and/or metadata associated with performance of the memory operation. An example of the cache memory 212 is a thirty two (32) way set-associative cache memory including multiple cache lines. The cache line size can be equal to or greater than the memory controller 200 access granularity (e.g., 64 bytes for a CXL protocol). For example, each cache line can include 256 bytes of data. In another example, each cache line can include 512 bytes of data. Read and write requests of CXL memory systems can be 64 bytes in size. Therefore, data entries in the cache memory 212 can have 64 bytes of data. Each cache line can comprise 256 bytes. Therefore, multiple 64 byte requests can be stored in each cache line. In response to a request from the host, the memory controller 200 can write 256 bytes of data to a memory device 226. In some embodiments, the 256 bytes of data can be written in 64 byte chunks. Use of the cache memory 212 to store data associated with a read operation or a write operation can increase a speed and/or efficiency of accessing the data because the cache memory 212 can prefetch the data and store the data in multiple 64 byte blocks in the case of a cache miss. Instead of searching a separate memory device, the data can be read from the cache memory 212. Less time and energy may be used accessing the prefetched data than would be used if the memory system has to search for the data before accessing the data.

The data management circuitry 210 can include a buffer 213 to store data, error detection information, error correction information, and/or metadata subject to an operation thereon by another component of the data management circuitry 210 (e.g., the error detection circuitry 211, the error correction circuitry 216, and the low-power chip kill circuitry). The buffer 213 can allow for the temporary storage of information, for example, while another component of the data management circuitry 210 is busy. In some embodiments, the cache memory 212 can be used to temporarily store data and the buffer 213 can be used to temporarily store other information associated with the data, such as error detection information, error correction information, and/or metadata.

The data management circuitry can include low-power chip kill (LPCK) circuitry (not illustrated). For instance, the LPCK circuitry can be coupled between the error detection circuitry 211 and the error correction circuitry 216. The LPCK circuitry can be configured to perform chip kill operations on the data. The term "chip kill" generally refers to a form of error correction that protects memory systems (e.g., the memory system 101 shown in FIG. 1) from any single memory device 226 (chip) failure as well as multi-bit error from any portion of a single memory chip. The LPCK circuitry can increase the stability of the data and correct errors in the data. The LPCK circuitry can implement the desired LPCK protection collectively across subsets of the memory devices 226 (e.g., LPCK can be provided for a first subset of the memory devices 226-1, 226-2 and separately for s second subset of the memory devices 226-(N−1), 226-N) or across all of the memory devices 226.

An example chip kill implementation for the memory controller 200 including an eleven channel 225 bus having a width of 176 bits coupled to eleven memory devices 226 can include writing data to eight of the eleven memory devices 226 and parity data to three of the eleven memory devices 226. Four codewords can be written, each composed of eleven four-bit symbols, with each symbol belonging to a different memory device 226. A first codeword can comprise the first four-bit symbol of each memory device 226, a second codeword can comprise the second four-bit symbol of each memory device 226, a third codeword can comprise the third four-bit symbol of each memory device 226, and a fourth codeword can comprise the fourth four-bit symbol of each memory device 226.

The three parity symbols can allow the LPCK circuitry to correct up to one symbol error in each codeword and to detect up to two symbol errors. If instead of adding three parity symbols, only two parity symbols are added, the LPCK circuitry can correct up to one symbol error but only detect one symbol error. In some embodiments, the data symbols and the parity symbols can be written or read concurrently from the memory devices 226. If every bit symbol in a die fails, only the bit symbols from that memory device 226 in the codeword will fail. This allows memory contents to be reconstructed despite the complete failure of one memory device 226. LPCK is considered to be "on-the-fly correction" because the data is corrected without impacting performance by performing a repair operation. The LPCK circuitry can include combinational logic that uses a feedforward process.

In contrast, a redundant array of independent disks (RAID) is considered to be "check-and-recover correction" because a repair process is initiated to recover data subject to an error. In some embodiments, the data management circuitry 210 includes RAID circuitry (not illustrated). For instance, the data management circuitry 210 can include RAID circuitry in lieu of LPCK circuitry. The RAID circuitry can provide one or more of data mirroring, data parity, striping, and combinations thereof depending on the particular implementation. The RAID circuitry can operate on data in conjunction with the error detection circuitry 211 to provide check-and-recover correction, whereas LPCK can provide on-the-fly correction. More specifically, the error detection circuitry can detect an error in data and the RAID circuitry can recover correct data in response. In at least one embodiment, the check-and-recover correction provided by the error detection circuitry 211 and the RAID circuitry is supplemental to the error correction provided by the error correction circuitry 216. For example, if data read from the memory devices 226 has an error correctable by the error correction circuitry 216, it can do so without further data recovery by the RAID circuitry. However, if an error persists that is not correctable by the error correction circuitry 216, then the data may be recoverable by the RAID circuitry. As another example, an error may escape detection by the error correction circuitry 216, but be detected by the error detection circuitry 211. In such an example, the underlying data may be recoverable by the RAID circuitry.

As shown in FIG. 2, the data management circuitry 210 can include error correction circuitry 216-1, 216-2 configured to perform error correction operations on the data (e.g., ECC encode the data and/or ECC decode the data). The error correction circuitry 216 can be coupled to the error detection circuitry 211 for embodiments (not specifically illustrated) that do not include the cache 212, buffer 213.

Although two error correction circuits 216 are illustrated, embodiments are not so limited. Embodiments can include only one error correction circuit 216 or more than two error correction circuits 216 in the data management circuitry 210. In at least one embodiment, the memory controller 200 can include an equal quantity of error correction circuits 216-1, 216-2 as media controllers 221-1, 221-2. The media controller 221-1, 221-2 can each include a respective channel controller and bank controller. For instance, media controller 221—can include channel controller 221-3 and bank controller 221-4. In at least one embodiment, the data can be protected by the error detection circuitry 211, LPCK circuitry, and/or the error correction circuitry 216 before being written to the memory devices 226.

The data management circuitry 210 can include the cache memory 212 and the buffer 213 coupled between the interface management circuitry 208 and the error correction circuitry 216. A quantity of error detection circuits and/or and a quantity of error correction circuits can be equal to the quantity of PHY memory interfaces 224-1, 224-2, . . . , 225-(N−1), 225-N. In such embodiments, there is a 1:1:1 correlation between the error correction circuits, the error detection circuits, and the memory devices. Though other configurations such as the configuration illustrated in FIG. 2 are possible.

In various embodiments, a controller coupled to one or more of the number of memory devices includes at least a first row hammer detector of a plurality of row hammer detectors. As used herein, a row hammer detector refers to hardware and/or software or other logic that permits detection of a row hammer event. In various embodiments, the row hammer detector can include or be coupled to a register or storage device. For instance, the row hammer detector can increment a row counter corresponding to the row address stored in a data structure in a register or storage device coupled to the controller in which the row hammer detector is included. As such, a row hammer detector can determine when target row experiences repeated accesses within a threshold amount of time.

The plurality of row hammer detectors can include a first row hammer detector and a second row hammer detector. For instance, the plurality of row hammer detectors can include a total quantity of two row hammer detectors (e.g., a first row hammer detector and a second row hammer detector). However, the plurality of row hammer detectors can include any quantity of row hammers detectors. For instance, the plurality of row hammer detectors can include a total quantity of three row hammer detectors (a first row hammer detector, a second row hammer detector, and a third row hammer detector), among other possibilities.

As detailed herein, the plurality of row hammer detectors are each disparate from the memory devices 226 and instead are included in the central controller 210 located apart from the memory devices 226. In some embodiments, the plurality of row hammer detectors that are disparate from the memory device 226 include a first row hammer detector and a second row hammer detector which are included in the memory controller 200. For instance, in various embodiments at least one row hammer detector is included in the central controller 210, a channel controller 221-2, a bank controller 222-1, or combinations thereof, as detailed herein.

For instance, as illustrated in FIG. 2 row hammer detection circuitry 215 can include a row hammer detector such as a first row hammer detector (as identified by "RHD1" in FIG. 2) can be located in the central controller 210 of the memory controller 200. That is, in various embodiments at least the first row hammer detector is included in the central controller 210. Having at least the first row hammer detector be included in the central controller 210 can reduce a quantity of events but increase a rate at which detection must occur over a given period of time. For instance, a quantity of events elsewhere (outside the central controller 210) may be higher due at least in part to a quantity of channels (e.g., 16 channels) and/or a quantity of banks involved in events however a given rate at which detection must occur can be relatively lower and correspond to a given portion of events in a particular channel/bank. Thus, in some embodiments, it may be desirable initial detection of a row hammer event with a first row hammer detector located at the central controller 210 and yet provide subsequent row hammer detection a media controller 221-1 such as in the channel controller 221-2 and/or bank controller 221-3. In this way, a quick initial detection of a potential row hammer event can be detector by the first row hammer detector (RHD1) located at the central controller 210 and can be subsequently confirmed by the second row hammer detector (e.g., the RHD2 located in a component (e.g., the channel controller 221-2 or the bank controller 221-3) of the controller 220 the channel controller 221-2, to promote timely, effective, and accurate row hammer detection as compared to other approaches that employ an individual row hammer detector. However, the first row hammer detector and/or the second row hammer detector can be located elsewhere in the memory controller 200. For instance, the first row hammer detector (RHD1) can be included in the central controller 210, the channel controller 221-2 or the bank controller 221-3. Similarly, the second row hammer detector (RHD2) can be included in the central controller 210, the channel controller 221-2 or the bank controller 221-3. For example, in some embodiments, the first row hammer detector is included in the central controller 201 and the second row hammer detector is included in the channel controller 221-2, as illustrated in FIG. 2. However, in some embodiments, the first row hammer detector is included in the central controller 201 and the second row hammer detector is included in the bank controller 221-3.

In some embodiments, the first row hammer detector and the second row hammer detector can be each located in the central controller 210 between the interface management circuitry 206 and physical interfaces 224 that are configured to be coupled to memory devices. In some embodiments, at least the first row hammer detector is included in the channel controller 221-2. For instance, the first row hammer detector can be included in the channel controller 221-2 and the second row hammer detector can be included in the bank controller 221-3.

While FIG. 2 illustrates the first row hammer detector as being included in a different controller from the second row hammer detector other configurations are possible. For instance, in some embodiments each of the first row hammer detector and the second row hammer detector can be located in the central controller 210 or in the media controller 222-1 (e.g., in the channel controller 221-2 or in the bank controller 221-3). For example, in various embodiments, each of the first row hammer detector and the second row hammer detector can be located in the central controller 210.

As shown in FIG. 2, the memory controller 200 can include a back end portion 219 including a media control circuitry 220 coupled to the data management circuitry 210. The media control circuitry 220 can include media controllers 221-1, 221-2. The back end portion 219 can include a physical (PHY) layer 222 having PHY memory interfaces 224-1, 224-2, . . . , 224-(N−1), 224-N. Each physical interface 224 is configured to be coupled to a respective memory device 226.

The PHY layer 222 can be a memory interface to configured for a deterministic memory protocol such as a LPDDRx memory interface. Each of the PHY memory interfaces 224 can include respective data pins 227 and DMI pins 229. For example, each PHY memory interface 224 can include sixteen data pins 227 "[15:0]" and two DMI pins 229 "[1:0]". The media control circuitry 220 can be configured to exchange data with a respective memory device 226 via the data pins 227. The media control circuitry 220 can be configured to exchange error correction information, error detection information, and/or metadata via the DMI pins 229 as opposed to exchanging such information via the data pins 227. The DMI pins 229 can serve multiple functions, such as data mask, data bus inversion, and parity for read operations by setting a mode register. The DMI bus uses a bidirectional signal. In some instances, each transferred byte of data has a corresponding signal sent via the DMI pins 229 for selection of the data. In at least one embodiment, the data can be exchanged contemporaneously with the error correction information, RAID information, and/or the error detection information. For example, 64 bytes of data can be exchanged (transmitted or received) via the data pins 227 while 35 bits of error detection information (and metadata) and 21 bits of error correction information are exchanged via the DMI pins 229. Such embodiments reduce what would otherwise be overhead on the DQ bus for transferring error correction information, error detection information, and/or metadata.

The back end portion 219 can couple the PHY layer portion 222 to memory banks 230-1, 230-2, . . . , 230-(N−1), 230-N of memory devices 226-1, 226-2, . . . , 226-(N−1), 226-N. The memory devices 226 each include at least one array of memory cells. In some embodiments, the memory devices 226 can be different types of memory. The media control circuitry 220 can be configured to control at least two different types of memory. For example, the memory devices 226-1, 226-2 can be LPDDRx memory operated according to a first protocol and the memory devices 226-(N−1), 226-N can be LPDDRx memory operated according to a second protocol different from the first protocol. In such an example, the first media controller 221-1 can be configured to control a first subset of the memory devices 226-1, 226-2 according to the first protocol and the second media controller 221-2 can be configured to control a second subset of the memory devices 226-(N−1), 226-N according to the second protocol. In a specific example, the memory devices 226-1, 226-2 may have on board error correction circuitry. Although not specifically illustrated, for some embodiments, the media controller circuitry 220 can include a single media controller 221.

As used herein, the term "substantially" means that the characteristic need not be absolute, but is close enough so as to achieve the advantages of the characteristic. For example, "substantially contemporaneously" is not limited to operations that are performed absolutely contemporaneously and can include timings that are intended to be contemporaneous but due to manufacturing limitations may not be precisely contemporaneously. For example, due to read/write delays that may be exhibited by various interfaces (e.g., LPDDR5 vs. PCIe), media controllers that are utilized "substantially contemporaneously" may not start or finish at exactly the same time. For example, the memory controllers can be utilized such that they are writing data to the memory devices at the same time regardless of whether one of the media controllers commences or terminates prior to the other.

The memory controller 200 can include a management unit 234 configured to initialize, configure, and/or monitor characteristics of the memory controller 200. In some embodiments, the management unit 234 includes a system management (SM) bus 238. The SM bus 238 can manage out-of-band data and/or commands. The SM bus 238 can be part of a serial presence detect. In some embodiments, the SM bus 238 can be a single-ended simple two-wire bus for the purpose of lightweight communication. The management unit 234 can include a CPU subsystem 240, which can function as a controller for the management unit to execute instructions associated with initializing, configuring, and/or monitoring the characteristics of the memory controller 200. The management unit 234 can include miscellaneous circuitry 242, such as local memory to store codes and/or data associated with managing and/or monitoring the characteristics of the memory controller 200. An endpoint of the management unit 234 can be exposed to the host system (e.g., the host 103 shown in FIG. 1) to manage data. In some embodiments, the characteristics monitored by the management unit 234 can include a voltage supplied to the memory controller 200 and/or a temperature measured by an external sensor. The management unit 234 can include an interconnect 236, such as an advanced high-performance bus (AHB) to couple different components of the management unit 234.

The management unit 234 can include circuitry to manage in-band data (e.g., data that is transferred through the main transmission medium within a network, such as a local area network (LAN)). In some embodiments, the CPU subsystem 240 can be a controller that meets the Joint Test Action Group (JTAG) standard and operate according to an Inter-Integrate Circuit (I²C or I³C) protocol, and auxiliary I/O circuitry. JTAG generally refers to an industry standard for verifying designs and testing printed circuitry boards after manufacture. I²C generally refers to a serial protocol for a two-wire interface to connect low-speed devices like microcontrollers, I/O interfaces, and other similar peripherals in embedded systems. In some embodiments, the auxiliary I/O circuitry can couple the management unit 234 to the memory controller 200. Further, firmware for operating the management unit can be stored in the miscellaneous circuitry 242. In some embodiments, the miscellaneous circuitry 242 can be a flash memory such as flash NOR memory or other persistent flash memory device.

Figure 3:
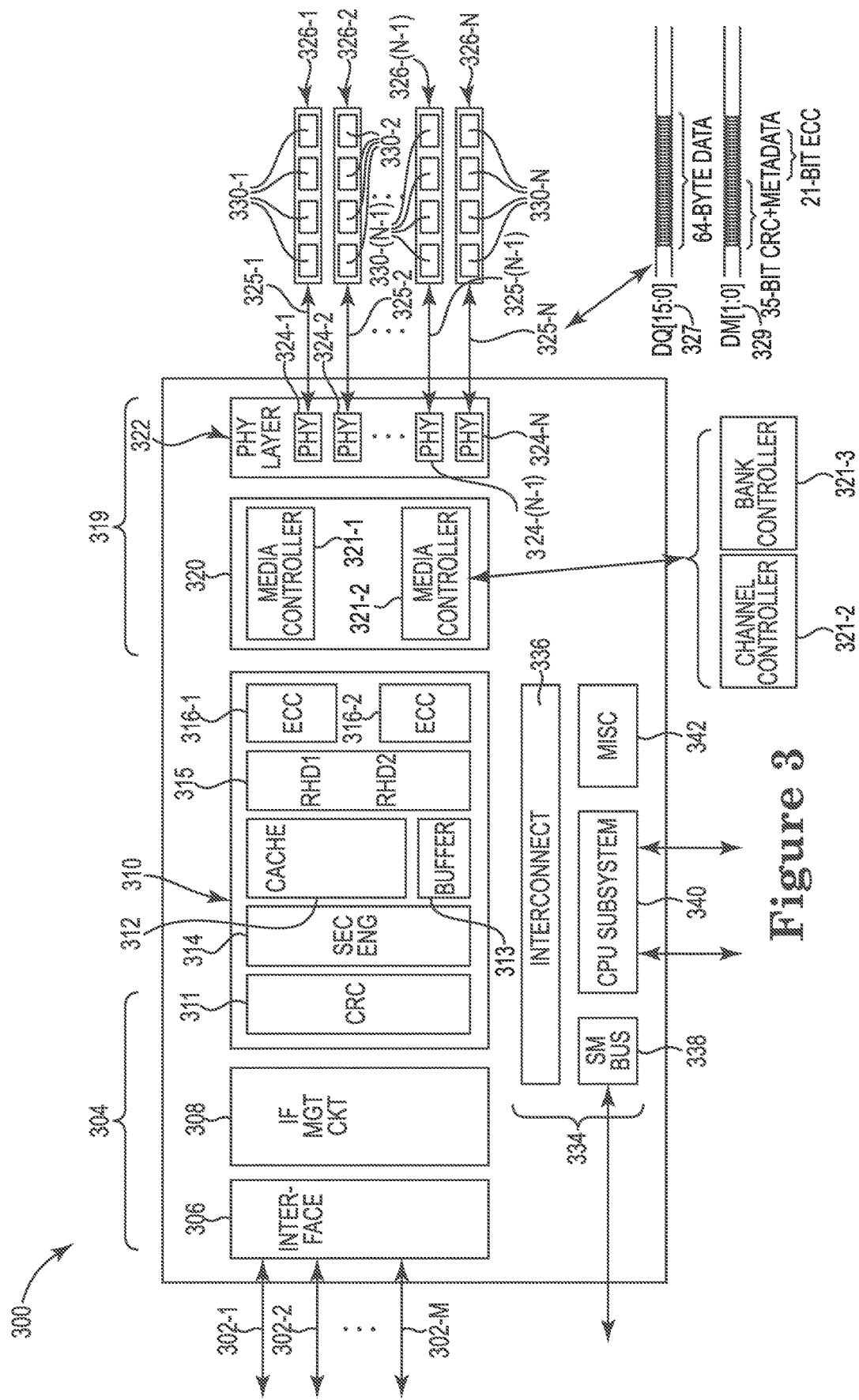
FIG. 3 is a functional block diagram of a memory controller having a second configuration in accordance with a number of embodiments of the present disclosure.

FIG. 3 is a functional block diagram of a memory controller 300 having a second configuration in accordance with a number of embodiments of the present disclosure. FIG. 3 is analogous to FIG. 2, except that the location of the second row hammer detector (RHD2) in row hammer detection circuitry 315 is included in the central controller 310 rather than in the media controller 320 and additional circuitry in the form of a security engine 314 is present in the central controller 310.

The security engine 314 can also be referred to as encryption circuitry 314. The encryption circuitry 314 can be configured to encrypt data before storing the data in memory devices 326 or cache memory 312 and/or decrypt data after reading the encrypted data from the memory devices 326 or the cache memory 312. An example of the encryption circuitry 314 is advanced encryption standard (AES) circuitry. However, in some embodiments the memory controller 300 can be provided without inclusion of the encryption circuitry (e.g., similar to FIG. 2).

As mentioned, the memory controller 300 can include a front end portion 304, the data management circuitry 310, and a back end portion 319. The front end portion 304 can include an interface 306, with multiple I/O lanes 302-1, 302-2, . . . , 302-M, as well as interface management circuitry 308 to manage the interface 306.

As mentioned, the data management circuitry 310 can include the cache memory (cache) 312 and the buffer 313 coupled between the error detection circuitry 311 and the error correction circuitry 316-1, 316-2. In some embodiments, the cache 312 is a set associative cache such as a thirty two (32) way set-associative cache memory including multiple cache lines. The cache line size of the cache 312 can be equal to or greater than the memory controller 300 access granularity (e.g., 64 bytes for a CXL protocol). As such, a size of each of the cache lines of the plurality of cache lines can be equal or greater than the memory controller access granularity. For example, each cache line can include 256 bytes of data, among other possibilities. In another example, each cache line can include 512 bytes of data.

The back end portion 319 can include media control circuitry 320 and a PHY layer 322. The media control circuitry 320 can include media controllers 321-1, 321-2. The PHY layer 322 can include PHY memory interfaces 324-1, 324-2, . . . , 324-(N−1), 324-N configured to be coupled to memory banks 330-1, 330-2, . . . , 230-(N−1), 330-N of memory devices 326-1, 326-2, . . . , 326-(N−1), 326-N via channels 325-1, 325-2, . . . , 325-(N−1), 325-N. Each of the PHY memory interfaces 324 can include respective data pins 327 and DMI pins 329. The memory controller 300 can include a management unit 334 including an interconnect 336, an SM bus 338, a CPU subsystem 340, and miscellaneous circuitry 342.

Figure 4:
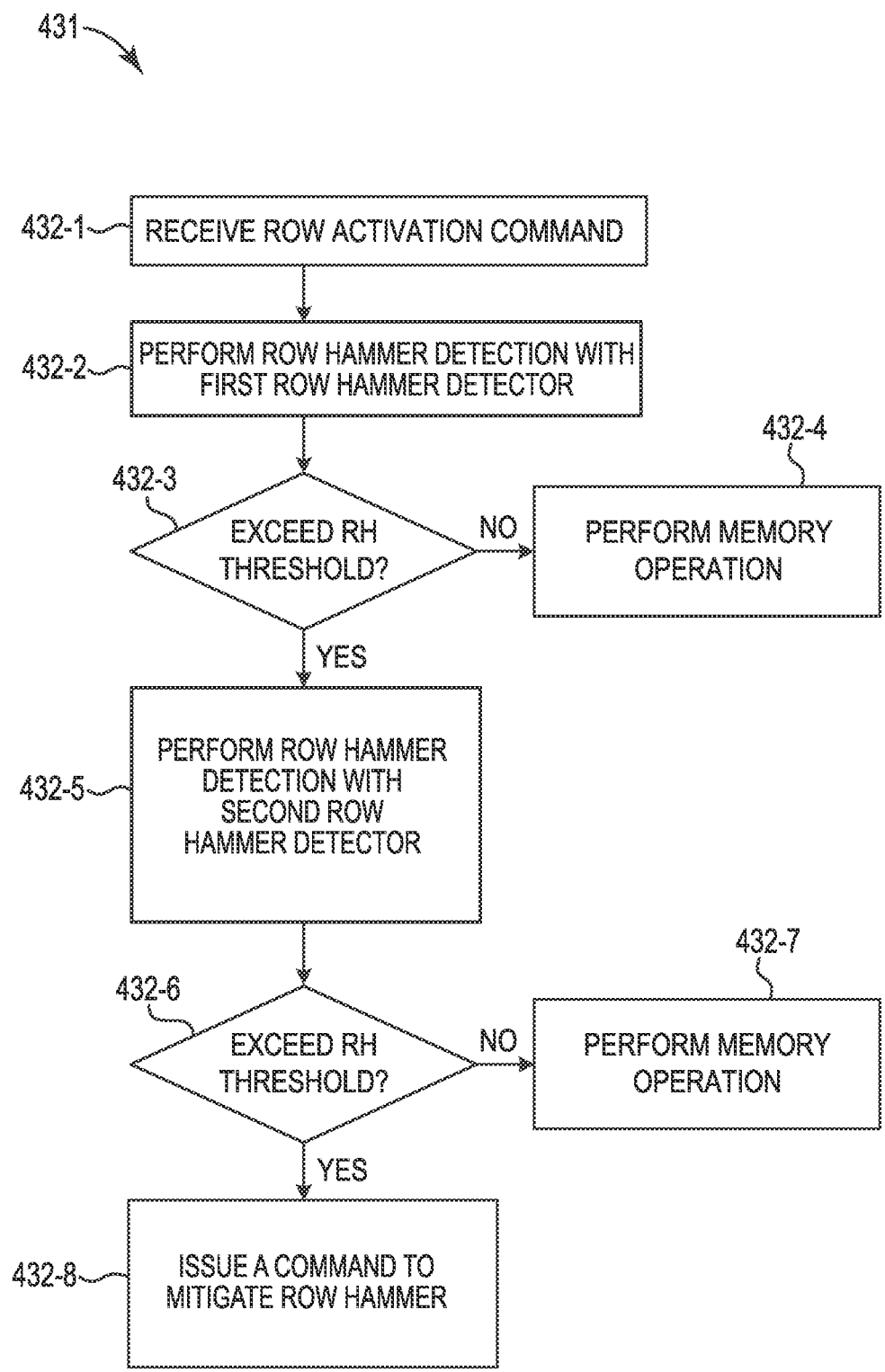
FIG. 4 is a functional flow diagram of a number of embodiments of the present disclosure.

FIG. 4 is a functional flow diagram 431 of a number of embodiments of the present disclosure. At 432-1 a row activation command can be received. For instance, an interface (e.g., interface 206 as illustrated in FIG. 2) can receive data (e.g., receive a first signal indicative of data associated with a memory access request) from the host through the I/O lanes (e.g., I/O lanes 202 as illustrated in FIG. 2). The signal can be transmitted to or intercepted by a controller such as a central controller (e.g., central controller 210 as illustrated in FIG. 2). That is, the row activation commend can be received by or can be intercepted by a controller. In some embodiments, the signal can be received or intercepted by a row hammer detector included in the row hammer detection circuitry 215.

At 432-2 row hammer detection can be performed with a first row hammer detector of a plurality of row hammer detectors located on a memory controller. For instance, row hammer detection can be performed with a first row hammer (RH) detector by incrementing a row counter corresponding to the row address stored in a register or other storage device of a first data structure of the first row hammer detector. At 432-3, the incremented row counter can be compared to a row hammer threshold such as a first row hammer threshold of the first row hammer detector. Comparison of the incremented row counter to the row hammer threshold can permit determination of when the incremented row counter is less than, equal to, or greater than the row hammer threshold.

Responsive to a determination that the incremented row counter is less than the row hammer threshold the flow 431 can proceed to 432-4. At 432-4 a memory operation can be performed. For instance, a signal indicative of the data can be transmitted to a cache and/or transmitted to memory devices. In this way, the host can perform a memory operation (e.g., a memory access request) associated with the cache 412 and/or the die 426.

Responsive to a determination that the incremented row counter is greater than (or equal to) the row hammer threshold the flow 431 can proceed to 432-5. At 432-5 a command to mitigate row hammer can be issued. The command to mitigate row hammer can be issues to a host, to a portion of a memory controller, and/or to a memory device.

Examples of commands to mitigate row hammer include commands associated with performing a refresh operation such as a refresh operation to a row address of the row activation command and/or to one or more row addresses that are adjacent to the row address of the row activation command, altering a refresh mode/timing, returning "bad"/"poison" data to a host, causing an interrupt such as an interrupt at a host, and/or providing a notification such as notification provided to a controller, among other possibilities. In any case, the command to mitigate row hammer can mitigate any impact (e.g., charge leakage, data corruption, power consumption, computation burden, etc.) associated with row hammer.

For instance, a command can cause a second row hammer detector included in the plurality of row hammer detectors at the memory controller to subsequently (subsequent to the first row hammer detector) perform row hammer detection. As mentioned, the second row hammer detector can be a different type of row hammer detector and/or can be located in a different portion of the memory controller than the first row hammer detector.

For instance, a type of the first row hammer detector can be different than a type of the second row hammer detector. In some embodiments, the first row hammer detector can include a first type of a probabilistic data structure and the second row hammer detector can include a second type of a probabilistic data structure that is different than the first type of probabilistic data structure. For example, the first type of probabilistic data structure can be a Bloom filter and the second type of probabilistic data structure can be a Count-Min filter. Use of the Bloom filter as the first type of filter can readily "screen" for possible row hammer events and avoid the presence of any false negatives. However, other types of filters such as a Cuckoo filter, a Vacuum filter, etc. are possible.

As mentioned, a first filter (e.g., a Bloom filter) of the first row hammer detector can act as an initial "screen" for possible row hammer events and a second filter (e.g., a Count-Min filter) of the second row hammer detector which may operate at a slower rate but have increased accuracy and/or filter through greater amounts of events, can act to validate the possible row hammer events. That is, the first row hammer detector can operate at a first rate (e.g., a given quantity of events per time period) and the second row hammer detector can operate a second rate that is different than the first rate. For instance, the first rate of a first row hammer detector can be greater than a second rate of a second row hammer detector. In this way, the first row hammer detector can quickly "screen" for possible row hammer events, while the second row hammer detector can accurately validate the possible row hammer events as being an actual row hammer event or not (e.g., a normal memory access).

In some embodiments, the first row hammer detector can occupy a first amount of storage in the memory controller and the second hammer detector can occupy a second amount of storage in the memory controller that is different than the first amount of storage. The differences in amounts of storage can be attributable at least in part due any differences in a respective type of the row hammer detectors and/or the row hammer detectors processing different respective amounts of events (e.g., having different sized data structures/tables). For example, a data table of a first row hammer detector can be a different size and/or different type than a data table of a second row hammer detector. In some embodiments, a first row hammer detector can occupy a first amount of storage in the memory controller that is less than a second amount of storage occupied in the memory controller by a second row hammer detector, among other possibilities.

In some embodiments, a memory controller can storage such as a single port SRAM that stores a first data structure of the first row hammer detector, a second data structure of the second row hammer detector, or both. Notably, in contrast to other approaches that rely on a presence of a large CAM, approaches herein can utilize less storage such as a single port SRAM that is less than 2.5 megabytes, and yet can provide enhanced row hammer detection, as detailed herein.

At 432-5 row hammer detection can be performed with a second row hammer detector of a plurality of row hammer detectors located on the memory controller. For instance, row hammer detection can be performed with the second row hammer (RH) detector by incrementing a row counter corresponding to the row address stored in a second data structure of the second row hammer detector. At 432-6, the incremented row counter of the second row hammer detector can be compared to a row hammer threshold such as a second row hammer threshold (SRHT) of the second row hammer detector.

Responsive to a determination that the incremented row counter is less than the second row hammer threshold the flow 431 can proceed to 432-7. The second row hammer threshold can be the same or different than the first row hammer threshold. For instance, the second row hammer threshold can be different than the first row hammer threshold when a first row hammer detector (e.g., a type, location, etc.) is different than a second row hammer detectors. At 432-7 a memory operation can be performed, as detailed herein.

Responsive to a determination that the incremented row counter is greater than (or equal to) the second row hammer threshold the flow 431 can proceed to 432-8. At 432-8, a subsequent command (subsequent to the command issued at 432-5) can be issued to mitigate row hammer. As mentioned, examples commands to mitigate row hammer include commands associated with performing a refresh operation, altering a refresh mode/timing, returning "bad"/"poison" data to a host, causing an interrupt, and/or providing a notification, among other possibilities.

Figure 5:
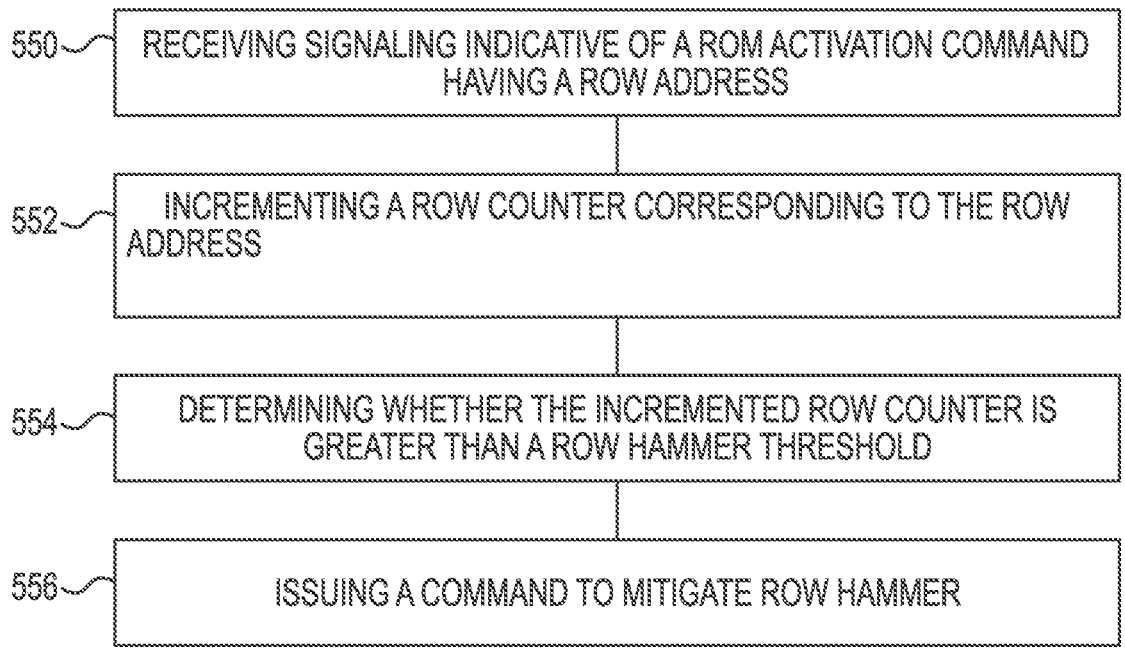
FIG. 5 is a flow diagram of a method for row hammer mitigation using hierarchical detectors in accordance with a number of embodiments of the present disclosure.

FIG. 5 is a flow diagram of a method for row hammer mitigation using hierarchical detectors in accordance with a number of embodiments of the present disclosure. The methods described herein (e.g., with respect to FIG. 5) can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At 550 the method can include receiving, a memory controller, signaling indicative of a row activation command having a row address in a memory device (e.g., the memory devices 126 as illustrated in FIG. 1). For instance, the method can include receiving signaling indicative of a row activation command from a host by CXL interface management circuitry of the memory controller. In some embodiments, a row activation command can be received at a central controller of the memory controller. For example, a controller such as the central controller can intercept the activation command (e.g., activation commands).

At 552, a row counter corresponding to the row address can be incremented. The row counter can be incremented by a predetermined amount. For instance, the row counter can be incremented by one or by a value greater than one. For example, the row counter can be incremented by one each time an access command having a row address is received by the memory sub-system. In some embodiments, a row counter corresponding to the row address in data structure of a first row hammer detector of a plurality of row hammer detectors can be incremented.

The row counter can be stored in a data structure of the memory sub-system. In some embodiments the data structure can be a probabilistic data structure. Examples of probabilistic data structures include Bloom filters and a Count-Min filters, among other possibilities. The data structure can be stored in the memory controller. For instance, the data structure can be stored in the same portion of the memory controller as a given row hammer detector utilizing the data structure, among other possibilities. That is, a given row hammer detector can include a corresponding data structure in a register or storage device included in or coupled to the given row hammer detector.

At 554, a determination can be made as to whether the row counter is greater than a row hammer threshold (RHT) such as a first row hammer threshold of a first row hammer detector. The determination can be made at a controller of the memory sub-system such as at a controller in which the first row hammer detector is included.

At 556, responsive to a determination that the row counter is greater than a RHT, a command to mitigate row hammer can be issued. For instance, a refresh command can be issued to the row address and/or to other row address such as to rows which are physically adjacent to the row address. However, other mitigation mechanisms such as those detailed herein are possible. Conversely, a determination that the row counter is less than (or equal to) a RHT can indicate that there are not negative implications to processing the access command and the access command can be permitted.

Although specific embodiments have been illustrated and described herein, those of ordinary skill in the art will appreciate that an arrangement calculated to achieve the same results can be substituted for the specific embodiments shown. This disclosure is intended to cover adaptations or variations of one or more embodiments of the present disclosure. It is to be understood that the above description has been made in an illustrative fashion, and not a restrictive one. Combination of the above embodiments, and other embodiments not specifically described herein will be apparent to those of skill in the art upon reviewing the above description. The scope of the one or more embodiments of the present disclosure includes other applications in which the above structures and processes are used. Therefore, the scope of one or more embodiments of the present disclosure should be determined with reference to the appended claims, along with the full range of equivalents to which such claims are entitled.

In the foregoing Detailed Description, some features are grouped together in a single embodiment for the purpose of streamlining the disclosure. This method of disclosure is not to be interpreted as reflecting an intention that the disclosed embodiments of the present disclosure have to use more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:

1. An apparatus, comprising:
a number of memory devices; and
a memory controller coupled to one or more of the number of memory devices, the memory controller including, interface management circuitry, a first row hammer detector; and
a second row hammer detector;
and wherein the memory controller is configured to:
receive signaling indicative of a row activation command and a row address;
increment a row counter corresponding to the row address stored in a data structure of the first row hammer detector coupled to the controller;
determine that the incremented row counter is greater than a row hammer threshold (RHT); and
responsive to determining that the incremented row counter is greater than the first RHT, issue a row hammer mitigation command to perform row hammer detection with the second row hammer detector.

2. The apparatus of claim 1, wherein the memory controller further comprises a central controller, a channel controller, a bank controller, or combinations thereof.

3. The apparatus of claim 2, wherein the row hammer detection circuitry includes a plurality of row hammer detectors, and wherein the plurality of row hammer detectors includes a at least three row hammer detectors.

4. The apparatus of claim 3, wherein at least the first row hammer detector is included in the central controller.

5. The apparatus of claim 4, wherein the second row hammer detector is included in the channel controller.

6. The apparatus of claim 4, wherein the second row hammer detector is included in the bank controller.

7. The apparatus of claim 4, wherein the second row hammer detector is included in the central controller.

8. The apparatus of claim 2, wherein at least the first row hammer detector is included in the channel controller, and wherein the second row hammer detector is included in the bank controller.

9. A method, comprising:
receiving, at interface management circuitry of a memory controller of a memory sub-system, signaling indicative of a row activation command having a row address, wherein the interface management circuitry is configured for a non-deterministic memory protocol;
incrementing a row counter corresponding to the row address stored in a data structure of a first row hammer detector included in a plurality of row hammer detectors of the memory controller;
determining, at the memory controller, whether the incremented row counter is greater than a first row hammer threshold (RHT) of a first row hammer detector; and
responsive to determining that the incremented row counter is greater than the first RHT, issuing a row hammer mitigation command to a second row hammer detector, to perform row hammer detection with the second row hammer detector.

10. The method of claim 9, wherein issuing the row hammer mitigation command further comprises issuing a command to initiate performing row hammer detection with a third row hammer detector included in the number of row hammer detectors.

11. The method of claim 10, wherein a type of the first row hammer detector is different than a type of the second row hammer detector.

12. The method of claim 11, wherein the first row hammer detector occupies a first amount of storage in the memory controller and the second hammer detector occupies a second amount of storage in the memory controller that is different than the first amount of storage, and wherein the first amount of storage is less than the second amount of storage.

13. The method of claim 10, wherein performing the row hammer detection with the second row hammer detector further comprises:
incrementing a row counter corresponding to the row address stored in a data structure of the second row hammer detector;
determining, at the memory controller, whether the incremented row counter is greater than a second row hammer threshold; and
responsive to determining that the incremented row counter is greater than the second row hammer threshold, issuing a subsequent row hammer mitigation command to mitigate row hammer.

14. A memory controller, comprising:
interface management circuitry configured for a non-deterministic memory protocol;
a first row hammer detector; and
a second row hammer detector; and wherein the memory controller is configured to:
receive, via the interface management circuitry, signaling indicative of a row activation command having a row address in a memory device;
increment a row counter corresponding to the row address stored in a first data structure of the first row hammer detector;
determine when an incremented row counter is greater than a first row hammer threshold of the first row hammer detector; and
responsive to determining that the incremented row counter is greater than the first row hammer threshold, issue a row hammer mitigation command to perform row hammer detection with the second row hammer detector.

15. The memory controller of claim 14, wherein the second row hammer detector is configured to:
increment a second row counter corresponding to the row address stored in a second data structure of the second row hammer detector;
determine the incremented second row counter is greater than a second row hammer threshold (SRHT); and
responsive to determining that the incremented second row counter is greater than the SRHT, issue a subsequent row hammer mitigation command to mitigate row hammer.

16. The memory controller of claim 15, wherein the subsequent row hammer mitigation command is a refresh command, and wherein the first row hammer detector and the second row hammer detector are each located between the interface management circuitry and physical interfaces that are configured to be coupled to memory devices.

17. The memory controller of claim 15, wherein:
the first row hammer detector includes a first type of a probabilistic data structure; and
the second row hammer detector includes a second type of a probabilistic data structure.

18. The memory controller of claim 17, wherein the first type of probabilistic data structure is a Bloom filter, and wherein the second type of probabilistic data structure is a Count-Min filter.

19. The memory controller of claim 18, wherein the memory device is row hammer detector-free.

20. The memory controller of claim 18, wherein the first row hammer detector is configured to operate at a first rate and the second row hammer detector is configured to operate at a second rate that is different than the first rate.

* * * * *